United States Patent
Lin et al.

(10) Patent No.: US 9,130,014 B2
(45) Date of Patent: Sep. 8, 2015

(54) METHOD FOR FABRICATING SHALLOW TRENCH ISOLATION STRUCTURE

(71) Applicant: UNITED MICROELECTRONICS CORP., Hsin-Chu (TW)

(72) Inventors: Keng-Jen Lin, Kaohsiung (TW); Yu-Ren Wang, Tainan (TW); Chien-Liang Lin, Taoyuan County (TW); Tsuo-Wen Lu, Kaohsiung (TW); Wei-Jen Chen, Tainan (TW); Chih-Chung Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 64 days.

(21) Appl. No.: 14/085,811

(22) Filed: Nov. 21, 2013

(65) Prior Publication Data

US 2015/0140780 A1   May 21, 2015

(51) Int. Cl.
*H01L 21/762* (2006.01)
*H01L 21/02* (2006.01)

(52) U.S. Cl.
CPC ...... *H01L 21/76237* (2013.01); *H01L 21/0217* (2013.01); *H01L 21/0228* (2013.01); *H01L 21/02164* (2013.01)

(58) Field of Classification Search
CPC ..................... H01L 21/76224; H01L 29/0649; H01L 21/302; H01L 29/06
See application file for complete search history.

(56) References Cited

U.S. PATENT DOCUMENTS

| | | | |
|---|---|---|---|
| 7,947,551 B1 | 5/2011 | Syue et al. | |
| 8,415,256 B1 * | 4/2013 | Nickel et al. | 438/761 |
| 2006/0128115 A1 * | 6/2006 | Chiu | 438/431 |
| 2006/0275974 A1 * | 12/2006 | Kwon et al. | 438/209 |
| 2007/0004170 A1 * | 1/2007 | Kawasaki et al. | 438/452 |
| 2009/0017597 A1 * | 1/2009 | Zhao et al. | 438/432 |
| 2011/0212620 A1 | 9/2011 | Liang et al. | |
| 2012/0034757 A1 * | 2/2012 | Choi et al. | 438/437 |

* cited by examiner

*Primary Examiner* — Khaja Ahmad
(74) *Attorney, Agent, or Firm* — Winston Hsu; Scott Margo

(57) ABSTRACT

A method for fabricating shallow trench isolation structure is disclosed. The method includes the steps of: (a) providing a substrate; (b) forming a trench in the substrate; (c) forming a silicon layer in the trench; and (d) performing an oxidation process to partially transform a surface of the silicon layer into an oxide layer.

7 Claims, 1 Drawing Sheet

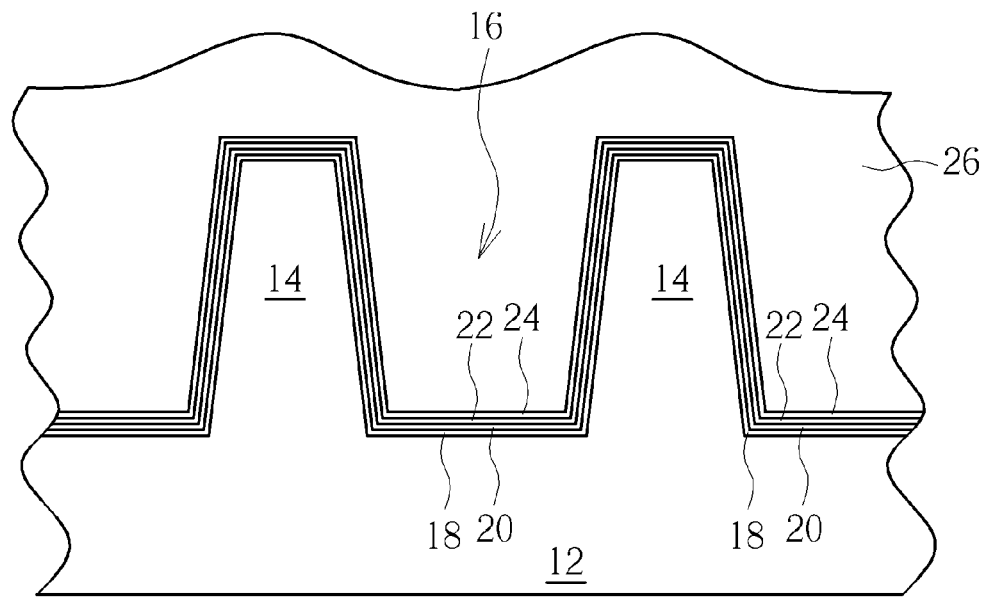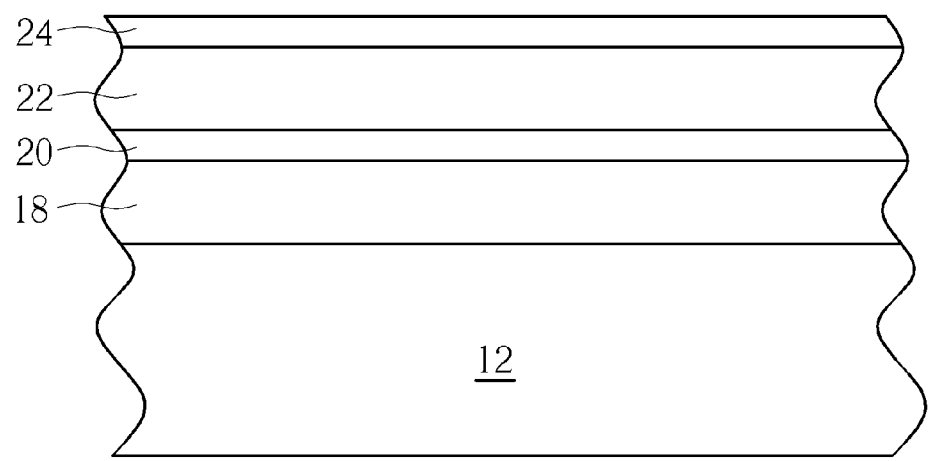

METHOD FOR FABRICATING SHALLOW TRENCH ISOLATION STRUCTURE

BACKGROUND OF THE INVENTION

1. Field of the Invention

The invention relates to a method for fabricating shallow trench isolation (STI) structure.

2. Description of the Prior Art

Generally, shallow trench isolations (STIs) are used to separate and isolate active areas on a semiconductor wafer from each other. These STIs have historically been formed by etching trenches, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

However, conventional means for fabricating STIs typically utilizes a flowable chemical vapor deposition (FCVD) or spin-on-dielectric (SOD) process to refill the trench with an oxide layer. As these processes have serious silicon consumption issues, an alternative approach of forming a stress buffer film (SBF) or amorphous silicon layer in the trench before filling of oxide layer has been derived. Nevertheless, the utilization of the SBF or amorphous layer also raises additional issues as the remaining of these layers while not being fully consumed, often results in bending of fin-shaped structures.

SUMMARY OF THE INVENTION

It is therefore an objective of the present invention to provide a novel process for improving the aforementioned issues.

According to a preferred embodiment of the present invention, a method for fabricating shallow trench isolation structure is disclosed. The method includes the steps of: (a) providing a substrate; (b) forming a trench in the substrate; (c) forming a silicon layer in the trench; and (d) performing an oxidation process to partially transform a surface of the silicon layer into an oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGURE illustrates a method for fabricating shallow trench isolation (STI) structure according to a preferred embodiment of the present invention.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Referring to the FIGURE, the FIGURE illustrates a method for fabricating shallow trench isolation (STI) structure according to a preferred embodiment of the present invention. As shown in the upper region of the FIGURE, a substrate 12 is provided, in which the substrate 12 may be a silicon substrate or a silicon-on-insulator (SOI) substrate. A plurality of fin-shaped structures 14 are then formed on the substrate 12, in which a plurality of trenches 16 are preferably formed between adjacent fin-shaped structures 14. It should be noted that for the sake of emphasizing the feature of the present invention, the layers forming in the trench 16 are emphasized in the lower region of the FIGURE.

The formation of the fin-shaped structures 14 could be accomplished by first forming a patterned mask (now shown) on the substrate, 10, and then performing an etching process to transfer the pattern of the patterned mask to the substrate 10 for forming the trench 16.

After the trench 16 is formed in the substrate 12, a silicon layer 18 is deposited in the trench 16, and an oxidation process is performed thereafter to partially transform a surface of the silicon layer 18 into an oxide layer 20.

The formation of the silicon layer 18 and the oxidation of the silicon layer 18 are described in detail below. Referring to the upper region of the FIGURE, the silicon layer 18 preferably including an amorphous silicon layer is formed on sidewalls and a bottom surface of the trench 16. The silicon layer 18 may also be consisting of polysilicon, and the silicon layer 18 may be formed by using a furnace system in a gaseous environment or may be formed conformally using technique such as low temperature chemical deposition process in a gaseous environment, which are all within the scope of the present invention.

After the silicon layer 18 is deposited, an oxidation process is carried out by injecting oxygen gas into the same reaction chamber to transform a portion of the silicon layer 18 surface into an oxide layer 20. Depending on the duration of the oxidation and amount of oxygen injected into the chamber, the oxidation process preferably only transforms a minor portion of the silicon layer 18 into a $SiO_2$ layer 20 and thereby producing a dual layer structure consisting of a $SiO_2$ layer 20 stacked on top of the original silicon layer 18.

Referring again to the lower region of the FIGURE, after the first oxidation is completed, another silicon layer 22 is formed on top of the oxide layer 20, and another oxidation process is performed thereafter in a similar fashion by injecting oxygen gas into the same reaction chamber to partially transform a surface of the silicon layer 22 into another oxide layer 24. Once more, depending on the duration of the oxidation and the amount of oxygen injected into the chamber, the second oxidation process only transforms a small portion of the silicon layer 22 into a $SiO_2$ layer 24 and thereby generating a dual layer consisting of a $SiO_2$ layer 24 atop the silicon layer 22.

Preferably, the aforementioned sequence of first depositing a silicon layer 18 in the trench 16 and then conducting an oxidation on the deposited silicon layer 18 thereafter may be continued repeatedly until a desired thickness of a combined structure containing interchanging silicon layers and oxide layers is achieved.

It should also be noted that even though only two silicon layers 18, 22 and two oxide layers 20, 24 are revealed in the FIGURE of the present embodiment, the quantity of the silicon layers and oxide layers is not limited to the ones disclosed in this embodiment. Instead, the formation of the silicon layer and the oxidation procedure followed up afterwards could be carried out as many times as possible until a desirable thickness is achieved according to the demand of product.

After forming multiple silicon layers and oxide layers with desirable thicknesses, a dielectric material 26 is formed on the deposited silicon and oxide layers to fill the trench 16 for forming a shallow trench isolation (STI) structure. Preferably, the dielectric material 26 is selected from a group consisting of silicon oxide and silicon nitride, but not limited thereto. The dielectric layer 26 is preferably formed by using a flowable chemical vapor deposition (FCVD) process, but could also be formed by utilizing a spin on dielectric (SOD) technique, which is also within the scope of the present invention.

After the dielectric material 26 is filled in the trench 16, an anneal process is conducted thereafter to densify the dielectric material 26, in which the anneal process preferably includes a steam anneal process, but not limited thereto. A selective planarizing process, such as a chemical mechanical polishing (CMP) process and an etching back could be carried out thereafter. As these processes are well known to those skilled in the art, the details of which are not explained herein for the sake of brevity. This completes the fabrication of a STI structure.

It should be noted that in the conventional arts where only an amorphous silicon layer is formed around the dielectric material 26, oxygen atoms are typically diffused from the deposited dielectric material 26 through the surrounding oxide layers 20, 24 and silicon layers 18, 22 and into the fin-shaped structure 14 as the dielectric material 26 consisting of silicon oxide is filled into the trench 16. This oxidation phenomenon while consuming a portion of the amorphous silicon layer around the deposited silicon oxide layer, still leaves at least a small portion of the amorphous silicon layer intact. The remaining amorphous silicon layer in most cases will likely to induce isolation or other defects.

By repeating the steps of forming a silicon layer (such an amorphous silicon layer) and oxidizing a portion of the silicon layer surface thereafter, the present invention could allow all of the silicon layer formed in the trench to be consumed as dielectric material consisting of silicon oxide is filled into the trench. For instance, the oxide layers 20, 24 shown in the FIGURE, or the oxidized portion of the silicon layers 18, 22 could be used to facilitate, enhance, and amplify the diffusion of oxygen atoms from the dielectric material 26 to the surrounding fin-shaped structure 14 as the dielectric material 26 consisting of silicon oxide is filled into the trench 16. As the dielectric material 26 fills the trench 16, the silicon layers 18, 22 are slowly consumed by the diffusion of oxygen atoms from the dielectric material 26 such that ultimately, all of the silicon layers 18, 22 will be consumed as the filling of the dielectric material 26 is completed. By using this approach, the present invention not only resolves the issue of silicon consumption brought by FCVD process, but also improves issues raised by the utilization of amorphous silicon layer substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating shallow trench isolation structure, comprising:
    (a) providing a substrate;
    (b) forming a trench in the substrate;
    (c) forming a silicon layer in the trench, wherein the silicon layer is an amorphous silicon layer;
    (d) performing an oxidation process to transform only part of a surface of the silicon layer into an oxide layer; and
    repeating steps (c) and (d).

2. The method for fabricating shallow trench isolation structure of claim 1, further comprising forming the silicon layer on sidewalls and a bottom surface of the trench.

3. The method for fabricating shallow trench isolation structure of claim 1, further comprising forming a dielectric material in the trench after step (d).

4. The method for fabricating shallow trench isolation structure of claim 3, wherein the dielectric material is selected from a group consisting of silicon oxide and silicon nitride.

5. The method for fabricating shallow trench isolation structure of claim 3, further comprising performing a flowable chemical vapor deposition (FCVD) process for forming the dielectric material.

6. The method for fabricating shallow trench isolation structure of claim 4, further comprising performing an anneal process to densify the dielectric material after performing the FCVD process.

7. The method for fabricating shallow trench isolation structure of claim 6, wherein the anneal process comprises a steam anneal process.

* * * * *